(12) United States Patent
Ron et al.

(10) Patent No.: US 9,017,802 B2
(45) Date of Patent: Apr. 28, 2015

(54) METHOD FOR IMPROVING THE DURABILITY OF AN INK PRINTED ON A SUBSTRATE AND SUBSTRATE FORMED FROM SUCH A METHOD

(75) Inventors: Hannoch Ron, Kadima (IL); Inna Tzomik, Modiin (IL); Shani Maor, Tel Aviv (IL)

(73) Assignee: Hewlett-Packard Indigo B.V., Amstelveen (NL)

( * ) Notice: Subject to any disclaimer, the term of this patent is extended or adjusted under 35 U.S.C. 154(b) by 876 days.

(21) Appl. No.: 13/046,612

(22) Filed: Mar. 11, 2011

(65) Prior Publication Data

US 2012/0231237 A1 Sep. 13, 2012

(51) Int. Cl.
| B41M 7/00 | (2006.01) |
| C23C 14/12 | (2006.01) |
| B05D 7/00 | (2006.01) |
| B05D 1/00 | (2006.01) |

(52) U.S. Cl.
CPC ....... *B41M 7/0054* (2013.01); *Y10T 428/24851* (2015.01); *C23C 14/12* (2013.01); *B05D 7/53* (2013.01); *B05D 1/60* (2013.01); *B05D 2203/22* (2013.01); *B05D 2451/00* (2013.01)

(58) Field of Classification Search
USPC ..................................................... 427/407.1
See application file for complete search history.

(56) References Cited

U.S. PATENT DOCUMENTS

| 4,794,651 A | 12/1988 | Landa et al. |
| 5,225,306 A | 7/1993 | Almog et al. |
| 5,264,313 A | 11/1993 | Landa et al. |
| 5,266,435 A | 11/1993 | Almog |
| 5,286,593 A | 2/1994 | Landa et al. |
| 5,346,796 A | 9/1994 | Almog |
| 5,737,666 A | 4/1998 | Lior et al. |
| 6,875,836 B2 | 4/2005 | Yoshihara et al. |
| 7,544,458 B2 | 6/2009 | Iraqi et al. |
| 2005/0075471 A1* | 4/2005 | Fan et al. ......................... 528/44 |
| 2006/0194138 A1 | 8/2006 | Regev et al. |
| 2008/0163788 A1 | 7/2008 | Silcoff et al. |
| 2008/0163789 A1 | 7/2008 | Silcoff et al. |
| 2009/0311614 A1 | 12/2009 | Almog et al. |
| 2010/0103437 A1 | 4/2010 | Li |

FOREIGN PATENT DOCUMENTS

| WO | 03065126 A1 | 8/2003 |
| WO | 2005054959 A1 | 6/2005 |
| WO | 2006044106 A1 | 4/2006 |
| WO | 2009014855 A2 | 1/2009 |
| WO | 2009096922 A1 | 8/2009 |
| WO | 2009151446 A1 | 12/2009 |
| WO | 2010042111 A1 | 4/2010 |
| WO | 2010053480 A1 | 5/2010 |

OTHER PUBLICATIONS

George et al., "Nanopatterning from the Gas Phase: High Resolution Soft Lithographic Patterning of Organosilane Thin Films," Langmuir Letter, 25(23), 2009, pp. 13298-13301.

* cited by examiner

*Primary Examiner* — William Phillip Fletcher, III
(74) *Attorney, Agent, or Firm* — Hewlett-Packard Patent Department

(57) ABSTRACT

The present disclosure is drawn to a method for improving the durability of an ink printed on a substrate. In an aspect, the method comprises:
(a) providing a substrate having an ink printed thereon;
(b) applying an organosilane to the ink to form a coating over the ink,
wherein the organosilane is of the formula $X-SiR_1R_2R_3$,
wherein $R_1$, $R_2$ and $R_3$ are all hydrolysable groups, and X comprises an a nucleophilic nitrogen-containing group which is covalently bonded to Si in $X-SiR_1R_2R_3$ via a non-hydrolysable linker group; and
(c) curing the organosilane. The present disclosure further describes a substrate having an ink printed thereon, wherein the ink has a coating thereon formed by applying an organosilane to the ink and curing the organosilane.

15 Claims, 5 Drawing Sheets

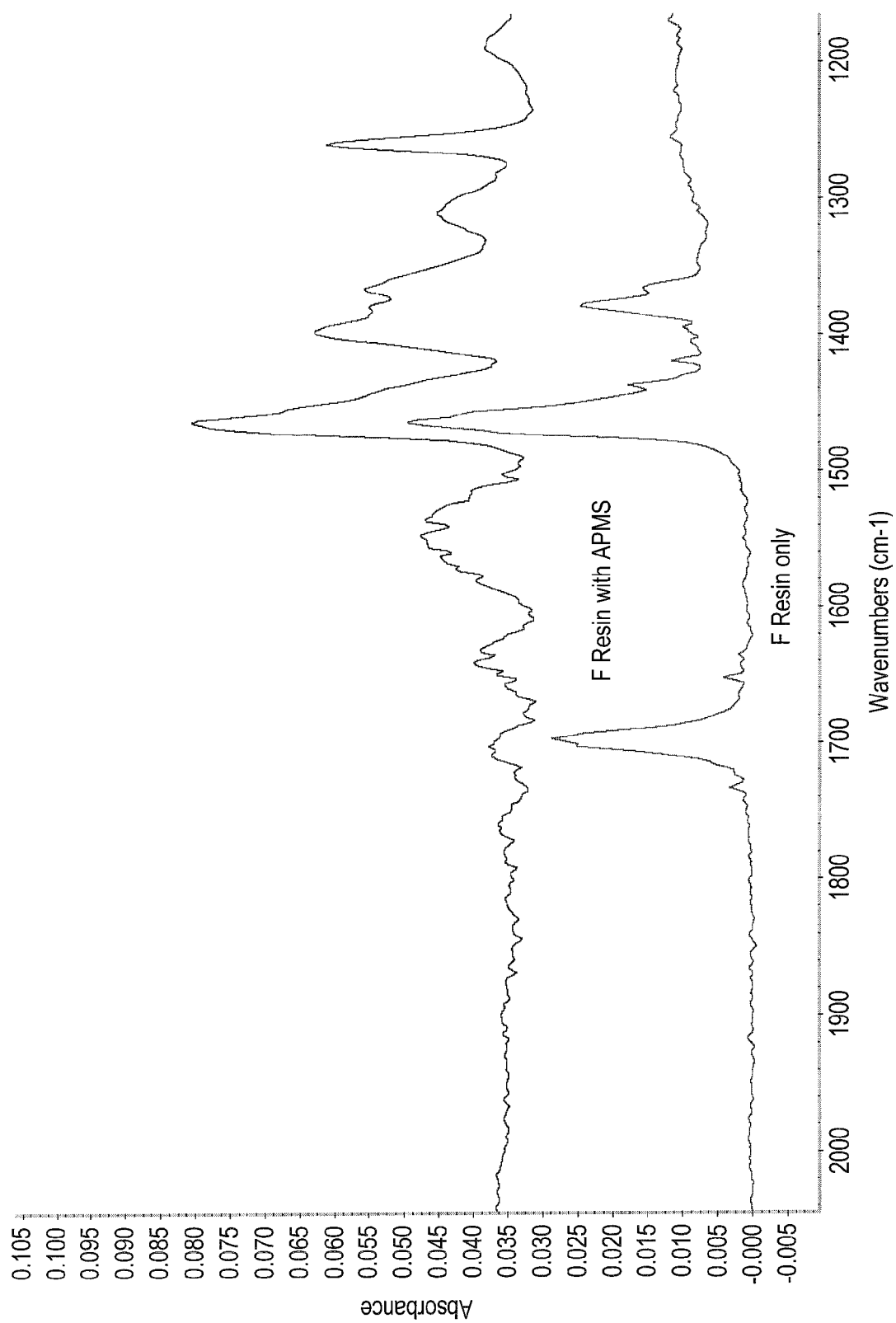

METHOD FOR IMPROVING THE DURABILITY OF AN INK PRINTED ON A SUBSTRATE AND SUBSTRATE FORMED FROM SUCH A METHOD

BACKGROUND

Printed ink is subjected to abrasive forces from the moment it is applied onto a substrate, e.g. paper or other suitable medium. The damage caused by the mechanical forces is classified into various categories, mainly due to the diverse appearance of the damage. In one form of damage, the ink surface may be scratched and as a result the gloss is reduced. In a second form of damage, the ink layer may be removed due to deeper scratches. In a third form of damage, the printed ink can be partially or completely torn out due to poor adhesion to the substrate. Among other effects, mechanical forces may smear the ink on the substrate.

Various methods have been developed over the years to reduce the negative effect of mechanical forces acting on printed inks. The latter can be divided into three categories namely: preprinting treatment of the substrate, suitable ink formulation and post printing treatments. The printed ink layer may vary from 1 to several micron thicknesses per ink separation depending on the printing method. Relatively thin printed ink layers such as those formed in offset printing as well as liquid electrostatic printing (LEP) may be protected by more than one of the above-mentioned techniques.

Pre-printing techniques involve coating of the substrate with a binding layer for improvement of adhesion. However, pre-printing treatment cannot protect against print surface scratches. Corona treatment is widely used for synthetic substrates such a polypropylene or polyethylene. However, Corona treatments are, generally speaking, specific to a narrow selection of synthetic substrate. In addition, poisonous ozone can be formed by the corona treatment.

Pre-coating of the substrate with an adhesion promotion layer is another type of pre printing treatment which can involve an off line coating process. Printing companies typically use out sourced coating services. As a result the printer is compelled to keep stocks of coated substrate, which can increase production cost.

The addition of suitable additives into the ink formulation is another way for reinforcing the ink layer. Wetting agents as well as adhesion promoters may improve adhesion of the ink to the substrate. Slipping agents such as hard wax dispersed in the ink form under suitable condition a protective layer on the ink surface and may also reduce friction coefficient of the ink thin layer allowing other prints to glide on the ink surface instead of abrading it.

Crosslinkable acrylate groups incorporated into the ink ingredients e.g. in the form of suitable solvent monomers or prepolymers, may improve durability to some extent. Post-printing exposure to heat or UV radiation is used for drying and activation of crosslinkable functional groups.

It is well known that the effect of the above discussed additives is limited to particular inks and depends on the substrate. In many cases these additives introduce unwanted side effects. Wax, for example, can imparts slip properties to the printed layer, and, as a result, other prints slip on top of the printed image and thus, the printed ink is less damaged. On the other hand, the solid wax particles which are not inherently part of the ink film layer can introduce micro defects. These imperfections may increase susceptibility to scratching by sharp objects. Cross linking of functional groups formulated into the ink such as UV curing materials may not be favoured due to the relatively expensive curing systems and the high energy consumption of these systems.

Post-printing reinforcement of printed ink may include coating the printed ink with a transparent layer. The applied layer creates a physical barrier which protects the ink layer. The protecting layer such as overprint varnish may be applied in the printing process as an additional colour separation. Protective varnish can be applied also offline using a coating system. Alternatively, coating the print with a thin solid laminate is widely used in the printing industry.

In a typical liquid electrostatic printer, the various inks are printed by the same printing engine, each ink in a separate printing engine cycle. More inks including overprint varnish would prolong the printing process.

However, in the case of offset lithography each ink is printed by a different printing engine. The addition of an ink would require an additional printing engine. Offline coating of printed material either by a liquid or solid coating requires additional exclusive coating process and system. It is worth mentioning that offline coating of sheet-fed prints is more complex than coating prints in a web form.

It would be desirable to provide a technique for improving the durability of printed inks that is an alternative to the techniques of the prior art and ideally overcomes at least one problem associated with the techniques of the prior art, whether or not expressly mentioned herein.

BRIEF DESCRIPTION OF THE FIGURES

FIG. 1A shows FITR measurements of a particular NUCREL resin, which has acidic side groups, dispersed in a hydrocarbon solvent (ISOPAR), both (i) alone (lower line) and (ii) in the presence of aminoethylaminopropyltrimethoxysilane (APMS) (upper line).

DETAILED DESCRIPTION

Figure 1B:
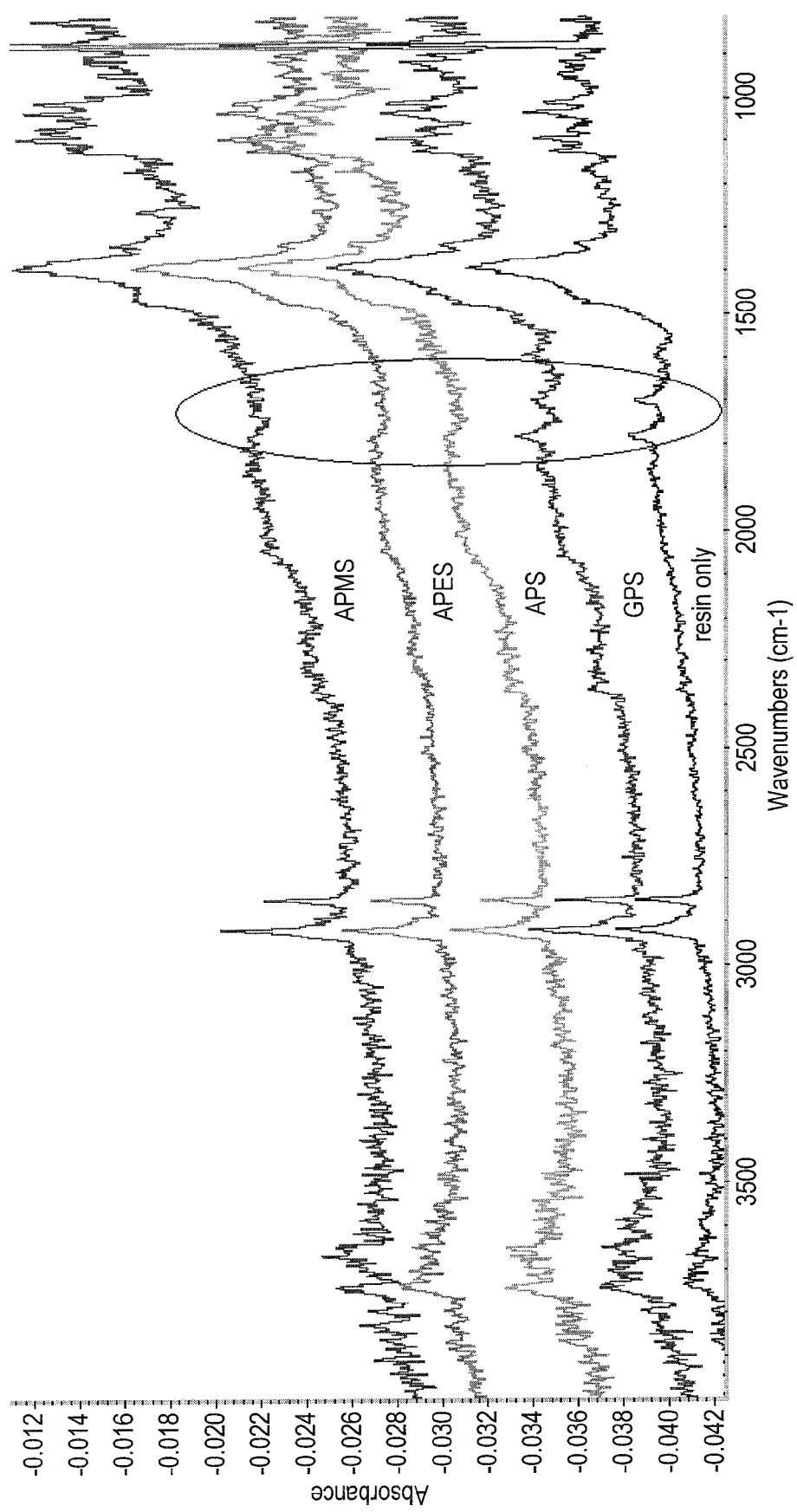
FIG. 1B shows FTIR measurements of the same NUCREL resin as FIG. 1A with various types of organofunctional silanes, including aminoethylaminopropyltrimethoxysilane (APMS), aminopropyltriethoxysilane (APES), aminopropyltrimethoxysilane (APS), and glycycloxypropyltrimethoxysilane (GPS), and without an organosilane present (i.e. resin alone)

Before the present invention is disclosed and described, it is to be understood that this invention is not limited to the particular process steps and materials disclosed herein because such process steps and materials may vary somewhat. It is also to be understood that the terminology used herein is used for the purpose of describing particular embodiments only. The terms are not intended to be limiting because the scope of the present invention is intended to be limited only by the appended claims and equivalents thereof.

It is noted that, as used in this specification and the appended claims, the singular forms "a," "an," and "the" include plural referents unless the context clearly dictates otherwise.

As used herein, "carrier liquid," "carrier," or "carrier vehicle" refers to the fluid in which the polymers, particles, colorant, charge directors and other additives can be dispersed to form a liquid electrostatic (or electrophotographic) ink composition. Such carrier liquids and vehicle components are known in the art. Typical carrier liquids can include a mixture of a variety of different agents, such as surfactants, co-solvents, viscosity modifiers, and/or other possible ingredients.

As used herein, "electrostatic ink composition" generally refers to a toner composition in liquid form that is typically suitable for use in an electrostatic or electrophotographic printing process.

As used herein, "pigment" generally includes pigment colorants, magnetic particles, aluminas, silicas, and/or other ceramics or organo-metallics, whether or not such particulates impart color. Thus, though the present description primarily exemplifies the use of pigment colorants, the term "pigment" can be used more generally to describe not only pigment colorants, but other pigments such as organometallics, ferrites, ceramics, etc.

As used herein, "copolymer" refers to a polymer that is polymerized from at least two monomers.

As used herein, "melt flow rate" generally refers to the extrusion rate of a resin through an orifice of defined dimensions at a specified temperature and load, usually reported as temperature/load, e.g., 190° C./2.16 kg. Flow rates can be used to differentiate grades or provide a measure of degradation of a material as a result of molding. In the present disclosure, "melt flow rate" is measured per ASTM D1238-04c Standard Test Method for Melt Flow Rates of Thermoplastics by Extrusion Plastometer, as known in the art. If a melt flow rate of a particular polymer is specified, unless otherwise stated, it is the melt flow rate for that polymer alone, in the absence of any of the other components of the liquid toner composition.

As used herein, "acidity," "acid number," or "acid value" refers to the mass of potassium hydroxide (KOH) in milligrams that is required to neutralize one gram of a substance. Measurement of acidity of a polymer may be carried out according to standard techniques known in the art, for example as described in ASTM D1386. If the acidity of a particular polymer is specified, unless otherwise stated, it is the acidity for that polymer alone, in the absence of any of the other components of the liquid toner composition.

As used herein, "electrostatic printing" or "electrophotographic printing" generally refers to the process that provides an image that is transferred from a photo imaging substrate either directly or indirectly to a printing substrate (such paper), typically via an intermediate transfer member. As such, the image is not substantially absorbed into the photo imaging substrate on which it is applied. Additionally, "electrophotographic printers" generally refer to those printers capable of performing electrophotographic printing, as described above. "Liquid electrophotographic printing" or "liquid electrostatic printing" is a specific type of electrophotographic printing where a liquid ink is employed in the electrophotographic process rather than a powder toner.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 wt % to about 5 wt %" should be interpreted to include not only the explicitly recited values of about 1 wt % to about 5 wt %, but also include individual values and subranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

SUMMARY OF THE INVENTION

In a first aspect, the present invention provides a method for improving the durability of an ink printed on a substrate, the method comprising:
(a) providing a substrate having an ink printed thereon;
(b) applying an organosilane to the ink to form a coating over the ink,
wherein the organosilane is of the formula X—$SiR_1R_2R_3$,
wherein $R_1$, $R_2$ and $R_3$ are all hydrolysable groups, and X comprises an a nucleophilic nitrogen-containing group which is covalently bonded to Si in X—$SiR_1R_2R_3$ via a non-hydrolysable linker group; and
(c) curing the organosilane.

In a second aspect, the present invention provides a substrate having an ink printed thereon, wherein the ink has a coating thereon formed by applying an organosilane to the ink and curing the organosilane, wherein the organosilane applied to the ink is of the formula X—$SiR_1R_2R_3$,
wherein $R_1$, $R_2$ and $R_3$ are all hydrolysable groups, and X comprises an a nucleophilic nitrogen-containing group which is covalently bonded to Si in X—$SiR_1R_2R_3$ by a non-hydrolysable linker group.

The following optional and preferred features are applicable to the first and second aspects.

The substrate having an ink printed thereon may be any suitable substrate. It may be termed a print substrate herein. The substrate may be any suitable substrate capable of having an image printed thereon. The substrate may comprise a material selected from an organic or inorganic material. The material may comprise a natural polymeric material, e.g. cellulose. The material may comprise a synthetic polymeric material, e.g. a polymer formed from alkylene monomers. The material may comprise a metal, which may be in sheet form. The metal may be selected from or made from, for instance, aluminum (Al), silver (Ag), tin (Sn), copper (Cu), mixtures thereof. In an embodiment, the substrate comprises a cellulosic paper. In an embodiment, the cellulosic paper is coated with a polymeric material, e.g. a polymer formed from styrene-butadiene resin. Optionally, the cellulosic paper has an inorganic material bound to its surface (before printing with ink) with a polymeric material, wherein the inorganic material may be selected from, for example, kaolinite or calcium carbonate. It has been found that the method of the present invention is particularly effective at protecting inks printed on coated cellulosic paper.

The ink printed on the substrate may comprise any suitable components. The ink may comprise a polymer having acidic side chains. It has been found that the organosilanes used in the present invention have a particular affinity to inks containing a polymer having acidic side groups. The polymer having acidic side groups may have an acidity of 50 mg KOH/g or more, optionally an acidity of 60 mg KOH/g or more, optionally an acidity of 70 mg KOH/g or more, optionally an acidity of 80 mg KOH/g or more, optionally an acidity of 90 mg KOH/g or more, optionally an acidity of 100 mg KOH/g or more, optionally an acidity of 105 mg KOH/g or more, optionally 110 mg KOH/g or more, optionally 115 mg KOH/g or more. The polymer having acidic side groups may have an acidity of 130 mg KOH/g or less, optionally 120 mg KOH/g or less. Acidity of a polymer, as measured in mg KOH/g can be measured using standard procedures known in the art, for example using the procedure described in ASTM D1386.

The polymer having acidic side groups can have a melt flow rate of about 10 g/10 minutes to about 120 g/10 minutes, optionally about 10 g/10 minutes to about 50 g/10 minutes, optionally about 50 g/10 minutes to about 120 g/10 minutes. The melt flow rate can be measured using standard procedures known in the art, for example as described in ASTM D1238.

The polymer having acid sides groups can be selected from resins such as copolymers of ethylene and an ethylenically unsaturated acid of either acrylic acid and methacrylic acid and ethylene-acrylic or methacrylic acid copolymers which are partially neutralized with metal ions (e.g. Zn, Na, Li) such as SURLYN® ionomers. The polymer comprising acidic side groups can be a copolymer of ethylene and an ethylenically unsaturated acid of either acrylic or methacrylic acid, where the ethylenically unsaturated acid of either acrylic or methacrylic acid constitute from 5 wt % to about 25 wt % of the copolymer, optionally from 10 wt % to about 20 wt % of the copolymer.

In one embodiment, the polymer having acid sides groups can be selected from copolymers of ethylene and an ethylenically unsaturated acid of either acrylic or methacrylic acid; an ionomer of ethylene methacrylic acid copolymer and an ionomer of ethylene acrylic acid copolymer. In one embodiment, the polymer having acid sides groups is a NUCREL® polymer selected from NUCREL® 925, NUCREL® 2906, NUCREL® 2806, NUCREL® 960 and NUCREL® 699, NUCREL® 599, and mixtures thereof.

The ink may comprise two different polymers having acidic side groups. The two polymers having acidic side groups may have different acidities, which may fall within the ranges mentioned above. The first component may comprise a first polymer having acidic side groups that has an acidity of from 50 mg KOH/g to 110 mg KOH/g and a second polymer having acidic side groups that has an acidity of more than 110 mg KOH/g to 130 mg KOH/g.

The ink may comprise two different polymers having acidic side groups: a first polymer having acidic side groups that has a melt flow rate of about 10 g/10 minutes to about 50 g/10 minutes, and a second polymer having acidic side groups that has a melt flow rate of about 50 g/10 minutes to about 120 g/10 minutes.

The ink may comprise two different polymers having acidic side groups that are selected from copolymers of ethylene and an ethylenically unsaturated acid of either acrylic acid and methacrylic acid and ethylene-acrylic or methacrylic acid copolymers which are partially neutralized with metal ions (e.g. Zn, Na, Li) such as SURLYN® ionomers. The first component may comprise (i) a first polymer that is a copolymer of ethylene and an ethylenically unsaturated acid of either acrylic acid and methacrylic acid, wherein the ethylenically unsaturated acid of either acrylic or methacrylic acid constitutes from 8 wt % to about 16 wt % of the copolymer, optionally 10 wt % to 16 wt % of the copolymer; and (ii) a second polymer that is a copolymer of ethylene and an ethylenically unsaturated acid of either acrylic acid and methacrylic acid, wherein the ethylenically unsaturated acid of either acrylic or methacrylic acid constitutes from 16 wt % to about 20 wt % of the copolymer, optionally from 17 wt % to 19 wt % of the copolymer.

Step (b) of the method comprises applying an organosilane to the ink printed on the substrate to form a coating over the ink. The organosilane is of the formula X—$SiR_1R_2R_3$, wherein $R_1$, $R_2$ and $R_3$ are all hydrolysable groups, and X comprises a nucleophilic nitrogen-containing group which is covalently bonded to Si in X—$SiR_1R_2R_3$ via a non-hydrolysable linker group.

In an embodiment, X is selected from (i) an optionally substituted amino group that is covalently bonded to Si in X—$SiR_1R_2R_3$ via the non-hydrolysable linker group, (ii) an azide that is covalently bonded to Si in X—$SiR_1R_2R_3$ via the non-hydrolysable linker group and (iii) a pyridine group that is covalently bonded to Si in X—$SiR_1R_2R_3$ via the non-hydrolysable linker group. The non-hydrolysable linker may be or may comprise an optionally substituted hydrocarbon group. The non-hydrolysable linker may comprise a hydrocarbon group having one or more heteroatoms in its structure. For example, the non-hydrolysable linker may comprise a hydrocarbon group having a moiety selected from an ester, ether and amide within its structure, as long as the hydrocarbon group is directly covalently bonded to the Si in the organosilane by a carbon atom. The non-hydrolysable linker may be selected from alkylene, alkenylene and alkynylene and optionally have 1 to 20 carbon atoms in its structure.

In an embodiment, X is an optionally substituted aminoalkyl group, optionally containing, excluding any substituents, 1 to 20 carbon atoms, optionally 1 to 10 carbon atoms, optionally 1 to 5 carbon atoms, optionally 2 to 4 carbon atoms. In the substituted aminoalkyl group, either the amino group or the alkyl group may have one or more substituents thereon. In an embodiment, the amino group has a substituent selected from $NH_2$—$(CH_2)_m$— and $SiR_5R_6R_7$—$(CH_2)_m$— thereon, wherein m is 1 to 10 and $R_5$, $R_6$ and $R_7$ are all hydrolysable groups, which may be as described herein for $R_1$, $R_2$ and $R_3$, and may be the same as or different from $R_1$, $R_2$ and $R_3$.

In an embodiment, X is of the formula $NHR_4$—$(CH_2)_n$—, wherein $R_4$ is selected from H and optionally substituted alkyl and n is 1 to 10.

In an embodiment, X is of the formula $NHR_4$—$(CH_2)_n$—, wherein n is 1 to 10 and $R_4$ is selected from H, $NH_2$—$(CH_2)_m$— and $SiR_5R_6R_7$—$(CH_2)_m$—, wherein m is 1 to 10, wherein $R_5$, $R_6$ and $R_7$ are all hydrolysable groups, which may be as described herein for $R_1$, $R_2$ and $R_3$, and may be the same as or different from $R_1$, $R_2$ and $R_3$.

In an embodiment wherein $R_1$, $R_2$, $R_3$ and, if present, $R_5$, $R_6$ and $R_7$, are each independently a group of the formula $OR_8$, wherein $R_8$ is a hydrocarbyl group, wherein the hydrocarbyl group may be selected from, for example an alkyl, alkenyl, alkynyl and acyl. The hydrocarbyl group in $R_8$ may contain 1 to 10 carbon atoms. In an embodiment wherein $R_1$, $R_2$, $R_3$ and, if present, $R_5$, $R_6$ and $R_7$, are each independently an optionally substituted alkyloxy group. The optionally substituted alkyloxy group may contain, excluding any substitutents that may be present, from 1 to 10 carbon atoms, preferably from 1 to 5 carbon atoms, preferably 1 to 3 carbon atoms. Most preferably, $R_1$, $R_2$, $R_3$ and, if present, $R_5$, $R_6$ and $R_7$, are each OMe.

In an embodiment, the organosilane is selected from aminopropyltrimethoxysilane (APS), aminopropyltriethoxysilane (APES), aminoethylaminopropyltrimethoxysilane (APMS), N-aminohexyl aminomethyltrimethoxysilane (AZA-APA), aminophenoxypropyltrimethoxysilane (APHENMS), bistrimethoxysilylpropylamine (BTMSA), bis-triethoxysilylpropylamine (BTESA), and mixtures thereof.

In an embodiment, X is of the formula $NH_2-(CH_2)_n-$, wherein n is 1 to 5, optionally 2, 3 or 4, and $R_1$, $R_2$ and $R_3$ are each OMe. In an embodiment, the organosilane is selected from aminopropyltrimethoxysilane (APS), bistrimethoxysilylpropylamine and mixtures thereof.

The organosilane may be applied by any suitable method, for example by applying the organosilane in a liquid or in a vapour. In an embodiment, the organosilane may be applied within a suitable carrier medium, for example a solvent that can dissolve the organosilane, for example a suitable organic solvent, e.g. ether. If applied in a carrier medium, the organosilane may be present in the carrier medium in an amount of from 5% by weight to 50% by weight, optionally 20% by weight to 40% by weight, optionally 25% by weight to 33% % by weight. In an embodiment, the organosilane may be applied in the absence of a carrier medium. The organosilane may be applied in a liquid, for example by spraying the substrate with the liquid containing, or being, the organosilane, or coating the substrate with the liquid containing, or being, the organosilane using a suitable application member. In an embodiment, the organosilane may be applied using a wire rod technique. Wire rod techniques for coating are known in the art and will not be described in detail herein. The appropriate diameter wire used in the wire rod technique may be chosen accordingly to achieve a desired coat weight.

In an embodiment, the organosilane may be applied by vapourising the organosilane under appropriate conditions and the contacting the substrate having the ink thereon with the vapourised organosilane, such that a layer of organosilane forms on the substrate. In an embodiment, the substrate having the ink on a downward-facing side thereof is placed above a receptacle containing the organosilane at a temperature at which the organosilane will form vapour, for example a temperature that is less than 80° C. below the melting point of the organosilane, e.g. less than 70° C. below the melting point of the organosilane. The temperature may, for example, be a temperature of 100° C. or more, optionally 110° C. or more, optionally 120° C. or more, optionally 130° C. The contacting of the substrate with the vapourised organosilane may be for a time period appropriate to form a desired coat weight of silane. The time period may, for example be from 10 seconds to 30 minutes, optionally from 30 seconds to 120 seconds.

In an embodiment, the organosilane is applied such that the coat weight of organosilane on the substrate (before curing) is at least 0.1 gsm, optionally at least 0.2 gsm, optionally at least 0.3 gsm, optionally at least 0.4 gsm, optionally at least 0.5 gsm, optionally at least 0.8 gsm, optionally at least 1 gsm, optionally at least 1.2 gsm. In an embodiment, the organosilane is applied such that the coat weight of organosilane on the substrate is from 0.1 gsm to 5 gsm, optionally 0.1 gsm to 4 gsm, optionally 0.1 gsm to 3 gsm, optionally 0.5 to 3 gsm.

Step (c) involves curing the organosilane. The curing is preferably carried out by heating the substrate having the organosilane thereon. The curing is preferably carried out by heating the substrate at an appropriate temperature for an appropriate period of time, such that a solidified coating forms. The curing is preferably carried out by heating the substrate at a temperature of at least 80° C., optionally at least 90° C., optionally at least 100° C. The curing may be carried out by heating the substrate at a temperature of from 80 to 130° C. The temperature should be below the boiling point of the organosilane, preferably at least 80° C. below the boiling point of the organosilane, preferably at least 70° C. below the boiling point of the organosilane, preferably at least 80° C. below the boiling point of the organosilane, preferably at least 80° C. below the boiling point of the organosilane. The heating may be carried out for a period of at least 20 second, optionally at least 40 seconds, optionally at least 60 seconds, optionally at least 120 second. The heating may be carried out for a period of from 20 seconds to 30 minutes, optionally 20 seconds to 15 minutes, optionally 20 seconds to 5 minutes, optionally 1 minute to 5 minutes.

In an embodiment, the method of the present invention provides a step before step (a) of providing a substrate and printing an ink thereon. The ink may be printed using an electrostatic process or an offset lithography process.

The step of printing using an electrostatic process may involve forming a latent electrostatic image on a surface;
  contacting the surface with an electrostatic ink composition containing particles in a liquid carrier and a charge director, wherein the particles contain a polymer, such that at least some of the particles adhere to the surface to form a developed toner image on the surface, and transferring the toner image to the substrate, to form the substrate having the ink printed thereon. The particles in an electrostatic ink composition are sometimes termed toner particles in the art.

Electrostatic ink compositions are known in the art. They typically comprise the particles in a liquid carrier and a charge director. The particles typically contain a polymer, which may be a polymer having acidic side groups as described herein. The polymer is typically a thermoplastic polymer, as known to the skilled person. The particles may further contain a colorant, e.g. a pigment.

Generally, the carrier liquid acts as a dispersing medium for the other components in the electrostatic ink composition. For example, the carrier liquid can comprise or be a hydrocarbon, silicone oil, vegetable oil, etc. As such, the carrier liquid can comprise or be a hydrocarbon-based carrier. Generally, the carrier liquids used for the inks of the present disclosure can be substantially similar to carriers used in prior art liquid electrophotography inks. Generally such inks include at least one aliphatic hydrocarbon, such as paraffins and isoparaffins. As such, carrier liquids can comprise, or substantially comprise, or even essentially consist of isoparaffins, such as or equivalent to the ISOPAR® high-purity isoparaffinic solvents with narrow boiling ranges marketed by Exxon Mobil Corporation (Fairfax, Va., USA). Also suitable as carrier liquids or components of carrier liquids for implementing embodiments of the present disclosure are alkanes having from about 6 to about 14 carbon atoms such as solvents sold under the NORPAR® (NORPAR® 12, 13 and 15) tradename available from Exxon Mobil Corporation (Fairfax, Va., USA). Other hydrocarbons for use as carrier liquids or vehicle components are sold under the AMSCO® (AMSCO® 460 and OMS) tradename available from American Mineral Spirits Company (New York, N.Y., USA), under the SOLTROL® tradename available from Chevron Phillips Chemical Company LLC (The Woodlands, Tex., USA) and under the SHELLSOL® tradename available from Shell Chemicals Limited (London, UK). Such carrier liquids and vehicle components have desirable properties such as low odor, lack of color, selective solvency, good oxidation stability, low electrical conductivity, low skin irritation, low surface tension, superior spreadability, narrow boiling point range, non-corrosive to metals, low freeze point, high electrical resistivity, high interfacial tension, low latent heat of vaporization and low photochemical reactivity.

The electrostatic ink composition may comprise a pigment. The toner particles of the liquid toner composition may comprise a pigment. The pigments dispersed in the carrier liquid can be any pigment compatible with the carrier liquid and useful for electrostatic printing. For example, the pigment may be present as pigment particles, or may comprise a resin (in addition to the polymers described herein) and a pigment. The resins and pigments can be any of those commonly used as known in the art. For example, pigments by Hoechst including Permanent Yellow DHG, Permanent Yellow GR, Permanent Yellow G, Permanent Yellow NCG-71, Permanent Yellow GG, Hansa Yellow RA, Hansa Brilliant Yellow 5GX-02, Hansa Yellow X, NOVAPERM® YELLOW HR, NOVAPERM® YELLOW FGL, Hansa Brilliant Yellow 10GX, Permanent Yellow G3R-01, HOSTAPERM® YELLOW H4G, HOSTAPERM® YELLOW H3G, HOSTAPERM® ORANGE GR, HOSTAPERM® SCARLET GO, Permanent Rubine F6B; pigments by Sun Chemical including L74-1357 Yellow, L75-1331 Yellow, L75-2337 Yellow; pigments by Heubach including DALAMAR® YELLOW YT-858-D; pigments by Ciba-Geigy including CROMOPHTHAL® YELLOW 3 G, CROMOPHTHAL® YELLOW GR, CROMOPHTHAL® YELLOW 8 G, IRGAZINE® YELLOW 5GT, IRGALITE® RUBINE 4BL, MONASTRAL® MAGENTA, MONASTRAL® SCARLET, MONASTRAL® VIOLET, MONASTRAL® RED, MONASTRAL® VIOLET; pigments by BASF including LUMOGEN® LIGHT YELLOW, PALIOGEN® ORANGE, HELIOGEN® BLUE L 690 IF, HELIOGEN® BLUE TBD 7010, HELIOGEN® BLUE K 7090, HELIOGEN® BLUE L 710 IF, HELIOGEN® BLUE L 6470, HELIOGEN® GREEN K 8683, HELIOGEN® GREEN L 9140; pigments by Mobay including QUINDO® MAGENTA, INDOFAST® BRILLIANT SCARLET, QUINDO® RED 6700, QUINDO® RED 6713, INDOFAST® VIOLET; pigments by Cabot including Maroon B STERLING® NS BLACK, STERLING® NSX 76, MOGUL® L; pigments by DuPont including TIPURE® R-101; and pigments by Paul Uhlich including UHLICH® BK 8200

The charge director is added to the carrier liquid in order to maintain sufficient electrostatic charge on the ink particles. For example, the charge components can be nanoparticles of a simple salt and a sulfosuccinate salt of the general formula $MA_n$, wherein M is a metal, n is the valence of M, and A is an ion of the general formula $[R_1-O-C(O)CH_2CH(SO_3^-)OC(O)-O-R_2]$, where each of $R_1$ and $R_2$ is an alkyl group, or other charge component as found in WO2007130069, which is incorporated herein by reference in its entirety. Additionally, charge director compounds include ionic compounds, particularly metal salts of fatty acids, metal salts of sulfosuccinates, metal salts of oxyphosphates, metal salts of alkylbenzenesulfonic acid, metal salts of aromatic carboxylic acids or sulfonic acids, as well as zwitterionic and non-ionic compounds, such as polyoxyethylated alkylamines, lecithin, polyvinylpyrrolidone, organic acid esters of polyvalent alcohols, etc. The charge director used herein can be any as known in the art such as described in U.S. Pat. No. 5,346,796, which is incorporated herein by reference in its entirety.

The electrostatic ink composition may comprise one or more additives, for example a charge adjuvant, a wax, a surfactant, biocides, organic solvents, viscosity modifiers, materials for pH adjustment, sequestering agents, preservatives, compatibility additives, emulsifiers and the like.

EXAMPLES

Example 1

Suitability of Organofunctional Silanes

In studies on the effect of organofunctional silanes (OFS) on inks (especially LEP inks), the present inventors identified several OFS which can be classified as film formers. These film former organofunctional silanes (FFOFS) tend to solidify into a homogeneous film when applied onto solid surfaces such as polyester, aluminum foils, paper as well as on printed inks. The film formed is generally transparent and may provide protection to the surface applied onto especially printed inks. The transparent film formed may increases gloss. The present inventors developed a simple test to identify and characterize film forming organosilanes (see table 1). In the test a wire-rod (#0) was used to coat 0.025 ml of an organofunctional silane on LEP printed ink (Cyan E.I 4.5 printed on HP Indigo press 5000). Enhancement of solidification speed was obtained by placing the coated print on a hot surface (100° C.) for 1 minute. Heating of the sample was set to 1 minute in order to identify fast curing FFOFS that have the potential to be applied on prints in line. After heating, the samples were left in ambient conditions for a week. The curing status of the films was examined several times. The contact angles in table 1 demonstrate that the OFS wet the printed ink surface. Yet, as we observed, hydrolysis of the OFS changes the wetting properties of the liquid OFS and in some cases dewetting of the OFS was observed.

The present inventors found that, of the organofunctional silanes tested, aminopropyltrimethoxysilane (APS) was the fastest curing FFOFS. APS forms a solid film in ambient condition and the relatively thin coatings are non tacky after ca. 5 min. Table 1 reveals that other amino containing organic silane molecules form films but much slower than the APS. It is reasonable to assume that hydrogen bonds are formed between the hydrolyzed silane groups and the amine groups. In addition, the polymer in the LEP ink contains acidic groups which the present inventors believe may interact with the nucleophilic amine groups of the amino-containing organosilanes. In a further experiment, different OFS reagents were mixed with a dispersion of resin used in LEP inks (a NUCREL resin). The resin was dispersed in Isopar L. FTIR measurements shown in FIGS. 1A and 1B indicate that the amino containing organosilanes interacted with the acidic groups. The decrease of acid COOH (1703 cm-1) peak together with appearance of new broad amine peak in the area 1550 cm-1 (after rinsing the polymer from reagents residues) indicate chemical interaction between polymer and amino containing organosilanes. This behaviour was not observed when non-amino organosilane coupling agents (GPS, CPS, and HDMS among others) replaced the amino containing organosilanes.

TABLE 1

| Organofunctional silanes [OFS] | Mw (gr./mol) | B.P (° C.) | Contact angle | Observations | Remark* |
|---|---|---|---|---|---|
| Aminopropyltri-methoxysilane (APS) | 179 | 194 | 17 | Forms transparent solid and continuous film within 1 min at 100° C. | FFOFS |
| Aminopropyltri-ethoxysilane (APES) | 221 | 217 | 14 | Most of reagent evaporated after 1 min. De-wetting while curing. | In a different test, thick layer of the material produced a milky solid on the print surface |
| Aminoethylamino-propyltrimethoxysilane (APMS) | 206 | 264 | 21 | The material was partially cured and a film was formed after 1 min. Thick film stayed sticky after 2 days | FFOFS |
| aminopropylmethyldiethoxy-silane (APDES) | 191 | 88/15 | 12 | Evaporated completely | |
| N-aminohexyl-aminomethyl-trimethoxysilane (AZA-APA) | 172 | 54 | 29 | The material was partially cured and a film formed after 1 min. Thick film stayed sticky after 2 days | FFOFS |
| Aminophenoxy-propyltrimethoxysilane (APHENMS) | 271 | 158 | 47 | The material did not cure after 1 min. The material was still wet after 2 days. A yellowish shiny film was formed after a further period. | FFOFS |
| bis-trimethoxy-silyl-propylamine (BTMSA) | 341 | 285 | 18 | The material was partially cured and a film was found after 1 min. It took a week before a fully cured film was formed. | FFOFS |
| bis-triethoxy-silylpropylamine (BTESA) | 425 | 160/0.6 | 12 | The material was partially cured and a film was formed after 1 min. It took a week before a fully cured film was formed. | FFOFS |
| Vinyltrimethoxy-silane (VTMS) | 148 | 123 | 11 | Partially evaporated. After a week some stains were left on the print surface. No film formed. | |
| Methacroyl-propyltrimethoxysilane (MTMS) | 248 | 250 | 15 | Material evaporated. Some stains were left on the printed surface. | |
| Vinyltriethoxy-silane (VTES) | 190 | 160 | 10 | Evaporated completely | No curing |
| Hexadecyltri-methoxysilane (HDMS) | 346 | >230 | 14 | Evaporated quickly | HDMS penetrated into the printed ink and softened it when a thick layer was applied |
| Chloropropyl-trimethoxysilane (CPS) | 199 | 199 | 11 | Evaporated quickly | |
| Glicydoxypropyl-trimethoxy-silane (GPS) | 236 | 290 | 24 | Evaporated completely | |
| Dimethyl-dimethoxysilane (DMDMS) | 120 | 81 | N/A | Evaporated completely | Fast evaporation |

TABLE 1-continued

| Organofunctional silanes [OFS] | Mw (gr./mol) | B.P (° C.) | Contact angle | Observations | Remark* |
|---|---|---|---|---|---|
| trimethoxysilyl-propyl-isocyanate (ICPTS) | 205 | 203 | 13 | Partially evaporated wet stains were present after 1 week | |
| polyethylene glycol sililated (PEGS) | | | 49 | Material was wet after 1 week | |

*FFOFS indicates that, in this test, the organofunctional silane was a film-forming organofunctional silane Experimental for Examples 2 to 5

Printed solid patches of Cyan ink with optical density (OD) in the order of 1.5 represented the printed samples in this work. Liquid Electro Photography (LEP) inks (ElectroInk 4.5 Cyan) were printed by HP Indigo 5000. The offset ink (Rapida Cyan) from Hostmann-Steinberg was printed by GTO Z 2 color press from Heidelberg.

Three types of substrate paper were utilized:
1. Condat Gloss 135 gr./m$^2$ (based on SBR resin) from Condat;
2. UPM Finesse 135 gr./m$^2$ from UPM, Kymi paper and pulp mill; and
3. Multifine 130 gr./m$^2$ from StoraEnso Coat Weight of OFS (Organofunctional Silane) Layer The coat weight of the APS (3-aminopropyltrimethoxy silane) layer was determined by XRF set for measuring coat weight of PDMS films from Oxford Instruments (model Lab-X3000). Due to the fact that beside silicone atom the APS molecule is comprised of amino propyl part, a calibration curve was prepared. APS was evaporated on polyester film and the coat weight was determined gravimetrically. (The polyester film was found most suitable for gravimetric and XRF coat weight analysis). The coat weight determined by XRF was compared to the coat weight determined by weight. Based on the latter we estimate that the XRF coat weight is half of the real coat weight.

Figure 2:
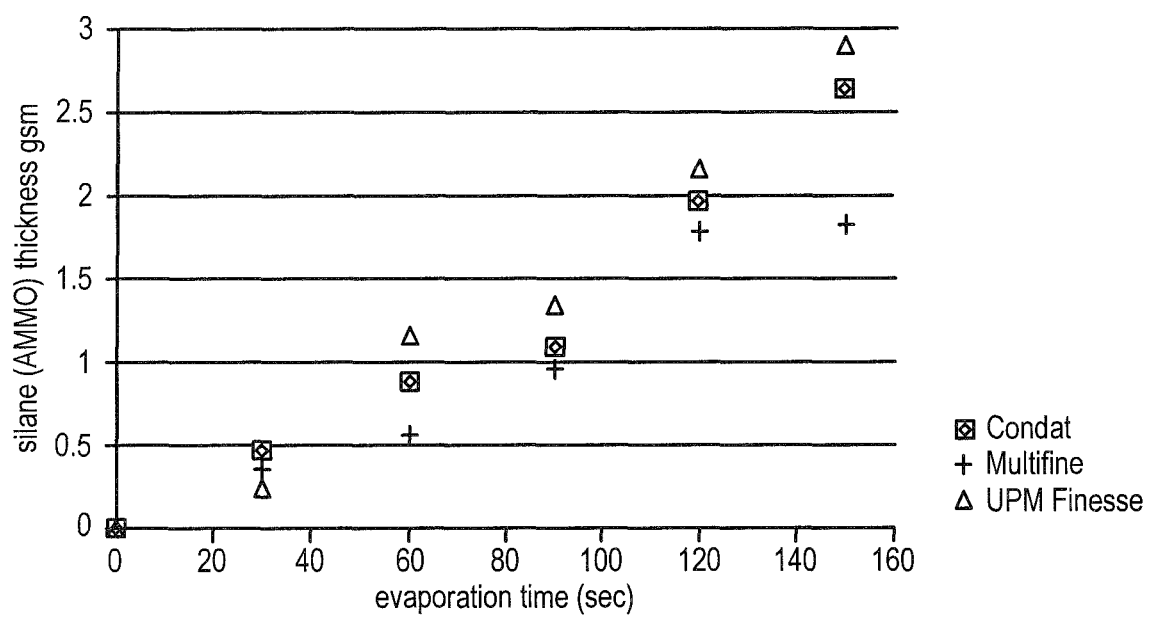
FIG. 2 shows a graph of the thickness, or coat weight, (in gsm) of APS against the evaporation time of the APS (the APS used has the tradename Dynasylan® AMMO from Evonik, Del.).

In FIG. 2 and table 2 the thickness (coat weight) of APS (3-aminopropyltrimethoxy silane, Dynasylan AMMO from Evonik) film on 3 different types of papers formed by various evaporation times is shown.

Abrasion Resistance

The durability of the printed ink was quantified by determining the damage caused to the printed samples using a rub resistance tester (B.S. 3110). In the test, a printed solid (100%) patch of ink was rubbed by an abrasive media (NO lapping film 9 micron from 3M) using Sutherland Ink Rub Tester (Danilee Co.). A load of four lb was applied. The samples were damaged upon applying 100 strikes to each of the tested samples. The damaged caused was quantified by comparison between the optical density (OD) of the damaged and non damaged print following eq. 1

$$\frac{OD \text{ damaged print}}{OD \text{ undamaged print}} \cdot 100 = \% \text{ of undamaged area} \quad \text{Eq. 1}$$

OD Damaged Print

The OD of the tested samples was measured by i1Pro spectrophotometer mounted on i1iO Automated Scanning Table from X-Rite. The data was processed using Profile-Maker 5 Photostudio software from Gretag Macbeth. The system was programmed to measure 100 spots of 8×6 mm from an area of 150×40 mm on each tested print.

Example 2

Vapor Deposited Organosilane Layer

A stainless steel (or aluminum) bath (28 cm wide 42.5 cm long and 0.7 cm deep) containing the liquid OFS was heated to 130° C. A print mounted on a metal plate was placed 3.0 cm above the hot bath facing the OFS liquid. The coating thickness was controlled by the time the print was exposed to the hot OFS bath. The layer formed on the print was cured by heating the coated print on a hot plate (100° C.) for 1 min.

Figure 3:
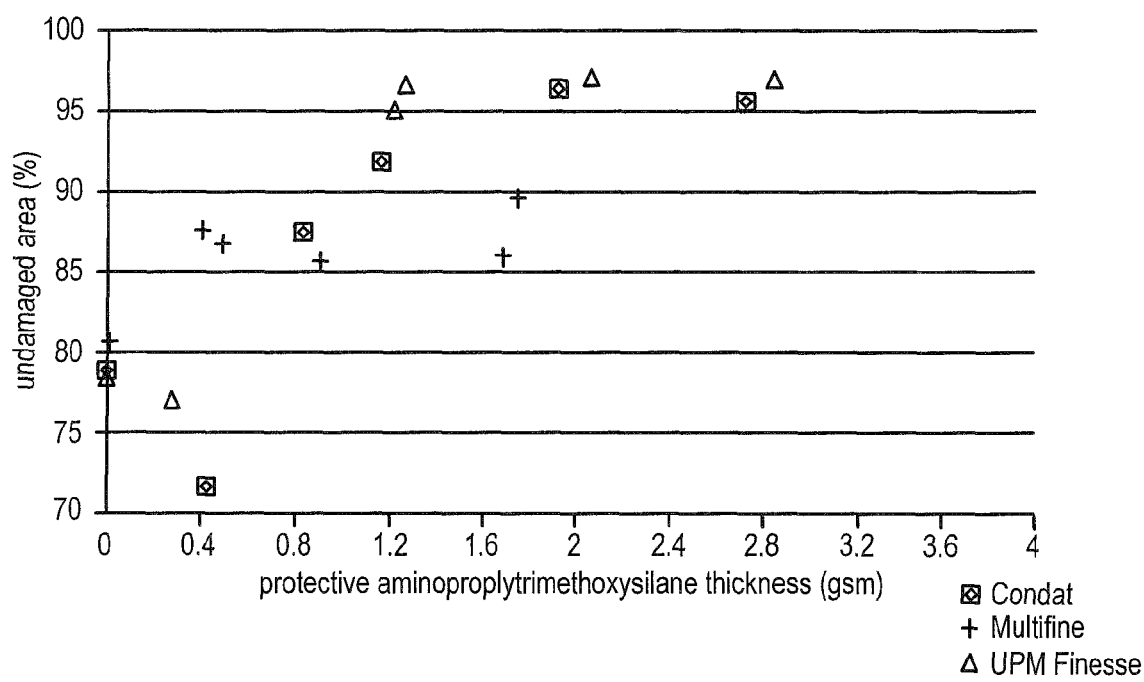
FIG. 3 shows a graph of % undamaged area in a rub test of various substrates having inks printed thereon and then coated with APS, against the thickness, or coat weight (in gsm) of APS.

On the whole, it is shown in FIG. 3 and table 2 that APS coating protects the print from mechanical damage. Yet, the protection is less prominent on the non coated paper. FIG. 1 shows that the coat weight built on the non coated paper upon evaporation of APS is lower compared to the layer built on the coated papers. Note that in this procedure the layer formed by evaporation is heated for 1 min at 100° C. for enhanced curing. Some of the APS evaporates while curing the layer. It is reasonable to assume that the stronger the affinity between the OFS and the substrate the less material will evaporate during the curing stage. In a similar trial for example, chloropropyl trimethoxysilane (CPS) evaporated completely during the curing stage.

TABLE 2

| Evaporation time (sec) | Condut | | Multifine | | UPM Finesse | |
|---|---|---|---|---|---|---|
| | coat weight (gsm) | durability [OD-P 100 strikes] | coat weight gsm | durability [OD-P 100 strikes] | coat weight (gsm) | durability {OD-P 100 strikes] |
| 0 | 0 | 78.44 | 0 | 80.97 | 0 | 78.31 |
| 30 | 0.46 | 71.28 | 0.36 | 87.58 | 0.24 | 76.89 |
| 60 | 0.88 | 87.43 | 0.56 | 86.99 | 1.16 | 94.83 |
| 90 | 1.1 | 91.95 | 0.96 | 85.86 | 1.34 | 96.57 |
| 120 | 1.96 | 96.84 | 1.78 | 86.12 | 2.16 | 97.51 |
| 150 | 2.64 | 95.85 | 1.82 | 89.6 | 2.9 | 97.15 |

Example 3

APS Coating on Offset Ink

Coating of offset prints with APS layer improved ink durability significantly (see table 3). APS has the lowest effect on the non-coated (Multifine) paper. The coat weight obtained after 2.5 min exposure to APS vapor (in the system described above) is significantly lower layer on coated papers. As a result no protection to the printed ink was achieved. See also similar behavior of printed LEP ink on Multifine paper in FIGS. 2 and 3 and table 2

TABLE 3

| | Paper Type | | |
|---|---|---|---|
| | Condat | Multifine | UPM |
| non damaged area % after 100 strike no APS layer | 57.31 | 83.49 | 62.45 |
| non damaged area % after 100 strikes | 90.19 | 83.44 | 84.35 |
| coat weight of APS 2.5 min evaporation gsm | 0.98 | 0.54 | 1.08 |

Example 4

Spray Coating

Spray gun from Preval (sprayer division, Valve corp. Yonkers, N.Y.) was used to spray APS (aminopropyltrimethoxy silane) onto LEP ElectroInk 4.5 Cyan printed on Condat paper. The material was sprayed neat and also from a solution in petroleum ether. The layer formed was not homogeneous. The deviation in the coat weight values determined by XRF is high. The latter can be improved by using a finer spray drop size. The results in table 4 show major improvement in the resistance to the damage caused by the abrasive lapping film. Introduction of petroleum ether reduces the coat weight as expected.

TABLE 4

| sample | gsm | undamaged area (%) |
|---|---|---|
| un-treated print | 0 | 78.44 |
| neat APS | 2.14 | 99.63 |
| 1:1 solution of APS in petroleum ether 40-60 | 2 | 98.75 |
| 1:4 solution of APS in petroleum ether 40-60 | 1.32 | 98.56 |

Example 5

Wire Rod Coating

Figure 4:
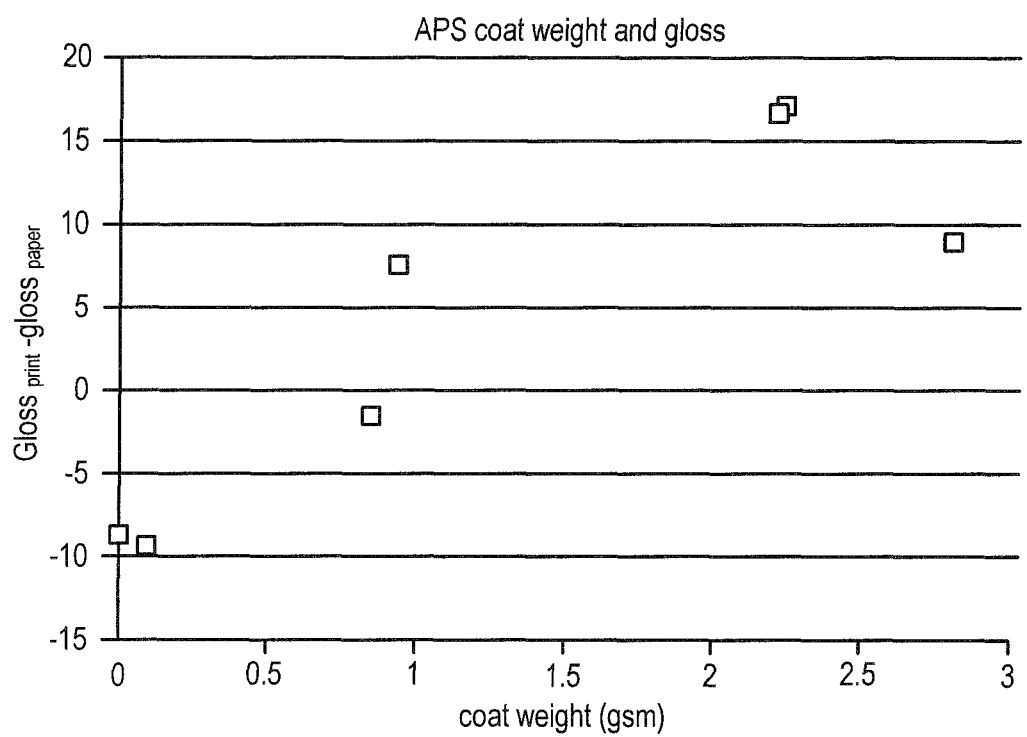
FIG. 4 shows a graph of print gloss against the coat weight (in gsm) of APS.

LEP ElectroInk 4.5 Cyan printed on Condat paper was coated with various coat weight of APS. The variation in coat weight was obtained by using different wire rods and by dilution of the APS by petroleum ether to various extents. Wire rods number 0, 1 and 2 from RK Print Coat Instruments UK were utilized. The gloss and coat weight reported were measured on the same coated prints. The diameter was 3.5 cm. It is shown in FIG. 4 and table 5 that the print gloss can be increased by the coat weight of the APS layer. The durability of the coated samples was tested as described above.

Examination of the rubbed samples showed tremendous improvement of the durability. In many samples the spectrophotometer measured meaningful changes in OD before and after rubbing although the printed ink was almost undamaged. We attribute the changes in the OD to the loss of gloss.

A mixtures of 10% (w/w) of bis-trimethoxysilylpropylamine (BTMSA) in APS was also applied using wire rod to obtain a protective coating.

TABLE 5

| coating parameters APS to petroleum ether ratio, wire rod number | coat weight gsm | print gloss | paper gloss | Δ gloss |
|---|---|---|---|---|
| non coated | 0 | 78 | 69 | −9 |
| 1:2 APS:PE W.R. 0 | 0.82 | 74 | 76 | −2 |
| 1:4 APS:PE W.R. 0 | 0.1 | 66 | 75.6 | −9.6 |
| 1:2 APS:PE W.R 1 | 2.76 | 85 | 75.8 | 9.2 |
| 1:4 APS:PE W.R 1 | 0.88 | 83 | 75.4 | 7.6 |
| 1:2 APS:PE W.R 2 | 2.22 | 93 | 76.3 | 16.7 |
| 1:4 APS:PE W.R. 2 | 2.24 | 94 | 77 | 17 |

While the invention has been described with reference to certain embodiments, those skilled in the art will appreciate that various modifications, changes, omissions, and substitutions can be made without departing from the spirit of the disclosure. It is intended, therefore, that the invention be limited only by the scope of the following claims.

The invention claimed is:

1. A method of coating an ink printed on a substrate, the method comprising:
    (a) providing a substrate having an ink printed thereon;
    (b) applying a composition consisting essentially of a non-polymeric organosilane to the ink to form a coating over the ink,
        wherein the organosilane is of the formula $X\text{-}SiR_1R_2R_3$, wherein $R_1$, $R_2$ and $R_3$ are all hydrolysable groups, and X comprises a nucleophilic nitrogen-containing group which is covalently bonded to Si in $X\text{—}SiR_1R_2R_3$ via a non-hydrolysable linker group; and
    (c) curing the organosilane.

2. A method according to claim 1, wherein X is selected from (i) an optionally substituted amino group that is covalently bonded to Si in $X\text{—}SiR_1R_2R_3$ via the non-hydrolysable linker group, (ii) an azide that is covalently bonded to Si in $X\text{—}SiR_1R_2R_3$ via the non-hydrolysable linker group and (iii) a pyridine group that is covalently bonded to Si in $X\text{—}SiR_1R_2R_3$ via the non-hydrolysable linker group.

3. A method according to claim 1, wherein X is an optionally substituted aminoalkyl group.

4. A method according to claim 1, wherein X is of the formula $NHR_4\text{—}(CH_2)_n\text{—}$, wherein $R_4$ is selected from H and optionally substituted alkyl and n is 1 to 10.

5. A method according to claim 1, wherein X is of the formula $NHR_4\text{—}(CH_2)_n\text{—}$, wherein $R_4$ is selected from H, $NH_2\text{—}(CH_2)_m\text{—}$ and $SiR_5R_6R_7\text{—}(CH_2)_m\text{—}$, wherein m is 1 to 10, wherein $R_5$, $R_6$ and $R_7$ are all hydrolysable groups.

6. A method according to claim 1, wherein $R_1$, $R_2$ and $R_3$ are each independently an alkyloxy group.

7. A method according to claim 1, wherein X is of the formula $NH_2\text{—}(CH_2)_n\text{—}$, wherein n is 1 to 5 and $R_1$, $R_2$ and $R_3$ are each OMe.

8. A method according to claim 1, wherein the ink comprises a polymer having acidic side chains.

9. A method according to claim 1, wherein curing the organosilane in step (c) involves heating the substrate having the organosilane applied thereto to a temperature of from 80 to 130° C.

10. A method according to claim 1, wherein the organosilane is applied such that the coat weight of organosilane on the substrate is from 0.1 to 5 gsm.

11. A method according to claim 1, wherein the organosilane is applied such that the coat weight of the organosilane on the substrate is at least 0.5 gsm.

12. A method according to claim 1, wherein the organosilane is applied by vapour deposition.

13. A method according to claim 1, wherein the substrate, to which the ink is applied, comprises a paper substrate having a polymeric coating thereon.

14. A method according to claim 13, wherein the polymeric coating comprises a styrene-butadiene co-polymer.

15. A substrate having an ink printed thereon, wherein the ink has a coating thereon formed by applying a composition essentially of a non-polymeric an organosilane to the ink and curing the organosilane, wherein the organosilane applied to the ink is of the formula $X-SiR_1R_2R_3$, wherein $R_1$, $R_2$ and $R_3$ are all hydrolysable groups, and X comprises a nucleophilic nitrogen-containing group which is covalently bonded to Si in $X-SiR_1R_2R_3$ via a non-hydrolysable linker group.

* * * * *

UNITED STATES PATENT AND TRADEMARK OFFICE
CERTIFICATE OF CORRECTION

PATENT NO.       : 9,017,802 B2
APPLICATION NO.  : 13/046612
DATED            : April 28, 2015
INVENTOR(S)      : Hannoch Ron et al.

Page 1 of 1

It is certified that error appears in the above-identified patent and that said Letters Patent is hereby corrected as shown below:

IN THE CLAIMS

In column 17, line 7, in Claim 15, delete "composition" and insert -- composition consisting --, therefor.

Signed and Sealed this
Twenty-fourth Day of November, 2015

Michelle K. Lee
*Director of the United States Patent and Trademark Office*